(12) United States Patent
Blake et al.

(10) Patent No.: US 8,329,260 B2
(45) Date of Patent: Dec. 11, 2012

(54) COOLED CLEAVING IMPLANT

(75) Inventors: Julian G. Blake, Gloucester, MA (US); Paul J. Murphy, Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 690 days.

(21) Appl. No.: 12/181,516

(22) Filed: Jul. 29, 2008

(65) Prior Publication Data

US 2009/0232981 A1 Sep. 17, 2009

Related U.S. Application Data

(60) Provisional application No. 61/035,471, filed on Mar. 11, 2008.

(51) Int. Cl.
*C23C 14/48* (2006.01)
*C23C 14/58* (2006.01)
*C23C 14/54* (2006.01)
*C23C 14/10* (2006.01)

(52) U.S. Cl. ... 427/526; 427/527; 427/529; 250/492.21; 250/492.22

(58) Field of Classification Search .......... None
See application file for complete search history.

(56) References Cited

U.S. PATENT DOCUMENTS

| | | | |
|---|---|---|---|
| 4,124,802 A * | 11/1978 | Terasawa et al. | 250/492.2 |
| 5,244,820 A * | 9/1993 | Kamata et al. | 438/514 |
| 5,374,564 A | 12/1994 | Bruel | |
| 5,811,823 A * | 9/1998 | Blake et al. | 250/492.21 |
| 5,846,375 A * | 12/1998 | Gilchrist et al. | 156/345.52 |
| 5,985,742 A | 11/1999 | Henley et al. | |
| 5,994,207 A | 11/1999 | Henley et al. | |
| 6,010,579 A | 1/2000 | Henley et al. | |
| 6,013,563 A | 1/2000 | Henley et al. | |
| 6,013,567 A | 1/2000 | Henley et al. | |
| 6,033,974 A | 3/2000 | Henley et al. | |
| 6,048,411 A | 4/2000 | Henley et al. | |
| 6,155,909 A | 12/2000 | Henley et al. | |
| 6,159,824 A | 12/2000 | Henley et al. | |
| 6,159,825 A | 12/2000 | Henley et al. | |
| 6,162,705 A | 12/2000 | Henley et al. | |
| 6,171,965 B1 | 1/2001 | Kang et al. | |
| 6,184,111 B1 | 2/2001 | Henley et al. | |
| 6,187,110 B1 | 2/2001 | Henley et al. | |
| 6,204,151 B1 | 3/2001 | Malik et al. | |
| 6,245,161 B1 | 6/2001 | Henley et al. | |
| 6,248,649 B1 | 6/2001 | Henley et al. | |
| 6,274,459 B1 | 8/2001 | Chan | |
| 6,284,631 B1 | 9/2001 | Henley et al. | |
| 6,290,804 B1 | 9/2001 | Henley et al. | |
| 6,291,313 B1 | 9/2001 | Henley et al. | |
| 6,291,314 B1 | 9/2001 | Henley et al. | |

(Continued)

FOREIGN PATENT DOCUMENTS

JP 2007-513511 A 5/2007

(Continued)

*Primary Examiner* — Marianne L Padgett

(57) ABSTRACT

A substrate is implanted with a species to form a layer of microbubbles in the substrate. The species may be hydrogen or helium in some embodiments. The size at which the microbubbles are stable within the substrate is controlled. In one example, this is by cooling the substrate. In one embodiment, the substrate is cooled to approximately between −150° C. and 30° C. This cooling also may reduce diffusion of the species in the substrate and will reduce surface roughness when the substrate is cleaved along the layer of microbubbles.

17 Claims, 8 Drawing Sheets

U.S. PATENT DOCUMENTS

| | | | |
|---|---|---|---|
| 6,291,326 | B1 | 9/2001 | Henley et al. |
| 6,294,814 | B1 | 9/2001 | Henley et al. |
| 6,303,468 | B1 | 10/2001 | Aspar et al. |
| 6,335,264 | B1 | 1/2002 | Henley et al. |
| 6,335,534 | B1 * | 1/2002 | Suguro et al. ............ 250/492.21 |
| 6,391,740 | B1 | 5/2002 | Cheung et al. |
| 6,455,399 | B2 | 9/2002 | Malik et al. |
| 6,458,672 | B1 | 10/2002 | Henley et al. |
| 6,486,041 | B2 | 11/2002 | Henley et al. |
| 6,500,732 | B1 | 12/2002 | Henley et al. |
| 6,511,899 | B1 | 1/2003 | Henley et al. |
| 6,514,838 | B2 | 2/2003 | Chan |
| 6,528,391 | B1 | 3/2003 | Henley et al. |
| 6,558,802 | B1 | 5/2003 | Henley et al. |
| 6,582,999 | B2 | 6/2003 | Henley et al. |
| 6,632,724 | B2 | 10/2003 | Henley et al. |
| 6,790,747 | B2 | 9/2004 | Henley et al. |
| 6,969,668 | B1 | 11/2005 | Kang et al. |
| 7,056,808 | B2 | 6/2006 | Henley et al. |
| 7,160,790 | B2 | 1/2007 | Henley et al. |
| 7,166,520 | B1 | 1/2007 | Henley |
| 7,166,524 | B2 | 1/2007 | Al-Bayati et al. |
| RE39,484 | E | 2/2007 | Bruel |
| 8,148,237 | B2 * | 4/2012 | Ramappa et al. ............. 438/456 |
| 2002/0157790 | A1 * | 10/2002 | Abe et al. ..................... 156/334 |
| 2004/0084633 | A1 * | 5/2004 | Moffatt ..................... 250/492.2 |
| 2004/0187787 | A1 * | 9/2004 | Dawson et al. ............... 118/728 |
| 2006/0017895 | A1 * | 1/2006 | Sogard ............................ 355/30 |
| 2007/0042580 | A1 | 2/2007 | Al-Bayati et al. |
| 2007/0122936 | A1 * | 5/2007 | Park et al. ....................... 438/77 |
| 2008/0188011 | A1 | 8/2008 | Henley |
| 2008/0200039 | A1 * | 8/2008 | Li et al. ........................ 438/776 |
| 2012/0097868 | A1 * | 4/2012 | Dickerson et al. ......... 250/492.3 |
| 2012/0156860 | A1 * | 6/2012 | Ramappa et al. ............. 438/458 |

FOREIGN PATENT DOCUMENTS

| | | |
|---|---|---|
| JP | 2007-287855 A | 11/2007 |
| KR | 10-1999-0030065 A | 4/1999 |

* cited by examiner

COOLED CLEAVING IMPLANT

CROSS-REFERENCE TO RELATED APPLICATIONS

This application claims priority to the provisional patent application entitled "Cooled Cleaving Implant," filed Mar. 11, 2008 and assigned U.S. Application No. 61/035,471, which is hereby incorporated by reference.

FIELD

This invention relates to substrate cleaving, and, more particularly, to a process that controls microbubbles that are formed to cleave a substrate.

BACKGROUND

An ion implanter includes an ion source for converting a gas or a solid material into a well-defined ion beam. The ion beam typically is mass analyzed to eliminate undesired ion species, accelerated to a desired energy, and implanted into a target. The ion beam may be distributed over the target area by electrostatic or magnetic beam scanning, by target movement, or by a combination of beam scanning and target movement. The ion beam may be a spot beam or a ribbon beam having a long dimension and a short dimension.

Implantation of an ion species may allow a substrate to be cleaved. The species form microbubbles in the substrate material. These microbubbles are pockets of a gas or regions of an implanted species below the surface of the substrate that may be arranged to form a weakened layer or porous layer in the substrate. A later process, such as heat, fluid, chemical, or mechanical force, is used to separate the substrate into two layers along the weakened layer or porous layer.

Ostwald ripening may occur in substrates that have microbubbles. Ostwald ripening is a thermodynamic process where larger particles grow by drawing material from smaller particles because larger particles are more stable than smaller particles. Any atoms or molecules on the outside of a particle, which may be, for example, a microbubble, are energetically less stable than the more ordered atoms or molecules in the interior of a particle. This is partly because any atom or molecule on the surface of a particle is not bonded to the maximum possible number of neighboring atoms or molecules, and, therefore, is at a higher energy state than those atoms or molecules in the interior. The unsatisfied bonds of these surface atoms or molecules give rise to surface energy. A large particle, with a greater volume-to-surface ratio, will have a lower surface energy. To lower surface energy, atoms or molecules on the surface of smaller, less stable particles will diffuse and add to the surface of the larger, more stable particles. The shrinking of smaller particles will minimize total surface area and, therefore, surface energy. Thus, smaller particles continue to shrink and larger molecules continue to grow.

FIG. 1 is a view of Ostwald ripening in a substrate where microbubble size is not controlled. FIG. 1 is merely an illustration and is not to scale, although the $x_1$ and $x_2$ references will allow comparison of FIGS. 1-2 and 8-9. A species that forms the microbubbles 100 in the substrate 138 makes smaller microbubbles 101 and larger microbubbles 102. Due to their greater volume-to-surface ratio and lower surface energy, the larger microbubbles 102 will be more stable than the smaller microbubbles 101. To lower their surface energy, the smaller microbubbles 101 will diffuse to the larger microbubbles 102. Overall, the smaller microbubbles 101 may shrink and the larger microbubbles 102 may grow. Some of the species in the microbubbles 100 also may diffuse out of the substrate 138. Ostwald ripening and diffusion of the species out of the substrate 138 will affect the substrate 138 when it is cleaved along the weakened layer or porous layer represented by line 103.

Experiments with hydrogen implantation at a temperature between 40° C. and 100° C. suggest that at least some of the microbubbles 100 increase in size above approximately 50° C. or 60° C. Consequently, surface roughness may be increased if the temperature of substrate 138 is raised during implantation.

FIG. 2 is a view of the substrate of FIG. 1 after the substrate is cleaved. The substrate 138 in FIG. 1 was cleaved along the weakened layer or porous layer represented by line 103. As illustrated in FIG. 2, significant surface roughness 104 occurs due to Ostwald ripening and diffusion of the species out of the substrate 138. Due to the rough surface within a substrate when the substrate is separated into two layers along the weakened layer or porous layer, a polishing step after the substrate is cleaved may be required to make the surface of the substrate smooth enough for device manufacture. This polishing step is expensive and compromises the uniformity of the silicon on the surface of the substrate. Accordingly, there is a need in the art for an improved implantation process and, more particularly, an implantation process that will reduce the size at which microbubbles are stable within a substrate.

SUMMARY

According to a first aspect of the invention, a method is provided. The method comprises implanting a substrate with a species to form a layer of microbubbles in the substrate and controlling a size at which the microbubbles are stable within the substrate.

According to a second aspect of the invention, a method is provided. The method comprises implanting a substrate with hydrogen and helium to form a layer of microbubbles in the substrate and controlling a size at which the microbubbles are stable within the substrate.

According to a third aspect of the invention, a method is provided. The method comprises implanting a substrate with hydrogen to form a layer of microbubbles in the substrate and controlling a size at which the microbubbles are stable within the substrate.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
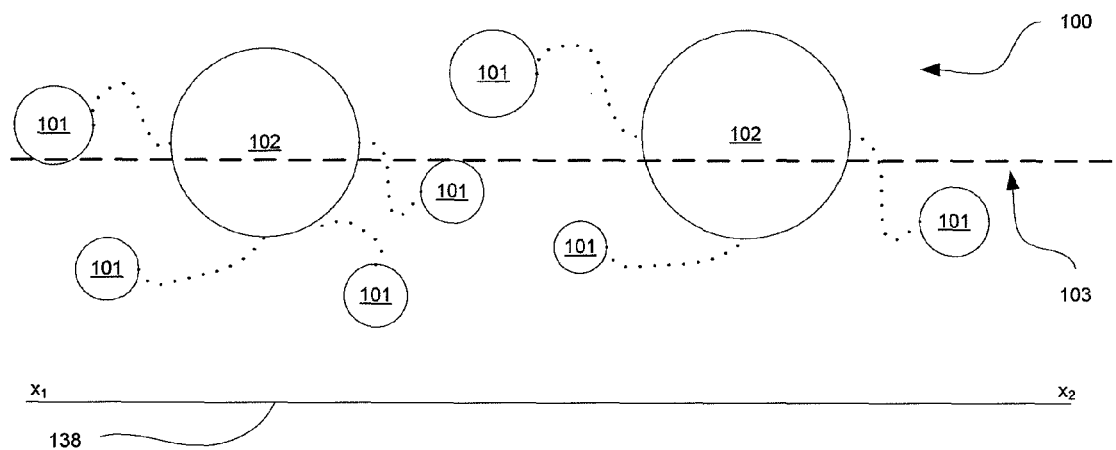
FIG. 1 is a view of Ostwald ripening in a substrate where microbubble size is not controlled.
Figure 2:
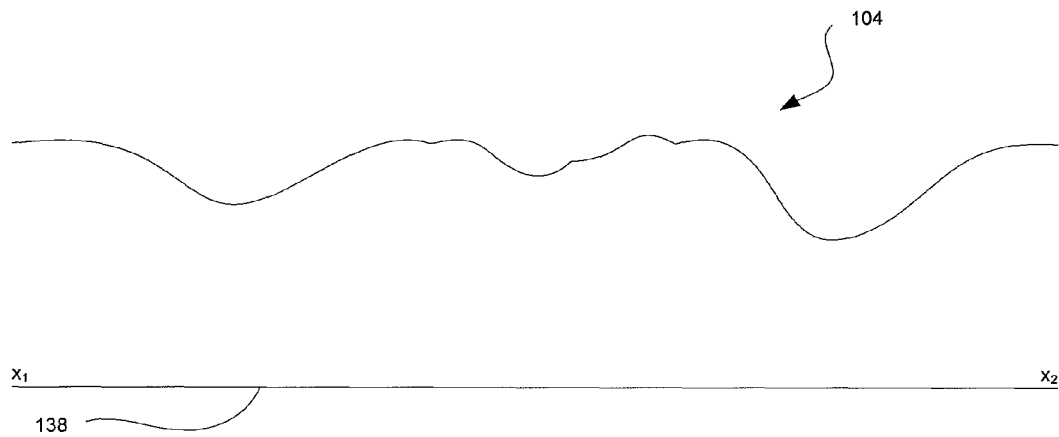
FIG. 2 is a view of the substrate of FIG. 1 after the substrate is cleaved.
Figure 3:
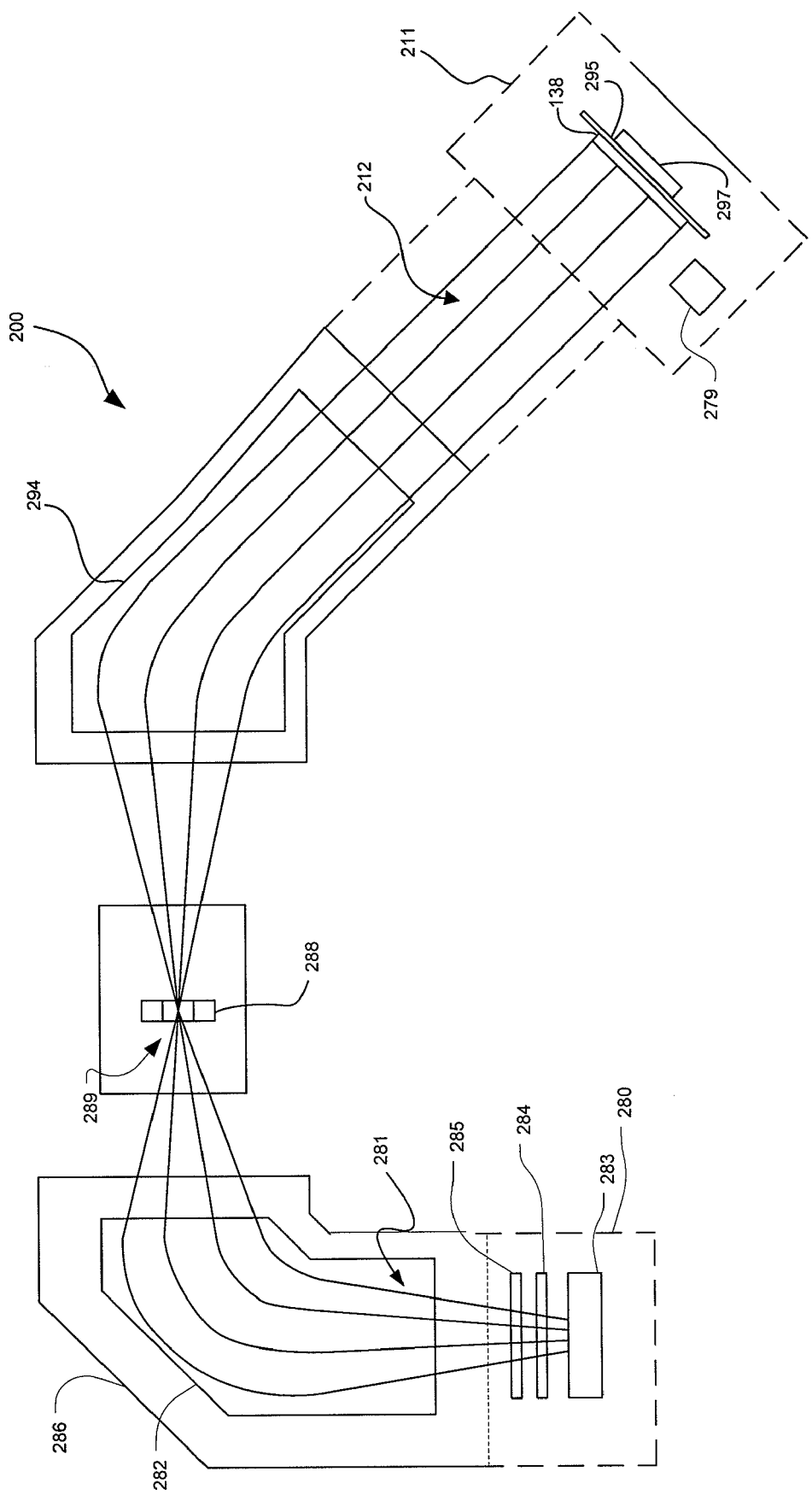
FIG. 3 is a block diagram of a beam-line ion implanter for doping a material with ions.

Turning to FIG. 3, a block diagram of a beam-line ion implanter 200 that may provide ions for doping a selected material is illustrated. Those skilled in the art will recognize that the beam-line ion implanter 200 is only one of many examples of beam-line ion implanters that can provide ions for doping a selected material. Thus, this process is not limited solely to the beam-line ion implanter 200 of FIG. 3.

In general, the beam-line ion implanter 200 includes an ion source 280 to generate ions that form an ion beam 281. The ion source 280 may include an ion chamber 283 and a gas box containing a gas to be ionized or a vaporizer to vaporize a solid to form a gas. The gas is supplied to the ion chamber 283 where the gas is ionized. This gas may be or may include or contain, in some embodiments, hydrogen, helium, other rare gases, oxygen, nitrogen, arsenic, boron, phosphorus, carborane $C_2B_{10}H_{12}$, or another large molecular compound. The ions thus formed are extracted from the ion chamber 283 to form the ion beam 281. The ion beam 281 is directed between the poles of resolving magnet 282. A power supply is connected to an extraction electrode of the ion source 280 and provides an adjustable voltage, for example, between about 0.2 and 80 kV in a high current ion implanter. Thus, singly-charged ions from the ion source are accelerated to energies of about 0.2 to 80 keV by this adjustable voltage.

The ion beam 281 passes through a suppression electrode 284 and ground electrode 285 to mass analyzer 286. Mass analyzer 286 includes resolving magnet 282 and masking electrode 288 having resolving aperture 289. Resolving magnet 282 deflects ions in the ion beam 281 such that ions of a desired ion species pass through the resolving aperture 289. Undesired ion species do not pass through the resolving aperture 289, but are blocked by the masking electrode 288. In one embodiment, resolving magnet 282 deflects ions of the desired species by about 90°.

Ions of the desired ion species pass through the resolving aperture 289 to the angle corrector magnet 294. Angle corrector magnet 294 deflects ions of the desired ion species and converts the ion beam from a diverging ion beam to ribbon ion beam 212, which has substantially parallel ion trajectories. In one embodiment, the angle corrector magnet 294 deflects ions of the desired ion species by about 70°. The beam-line ion implanter 200 may further include acceleration or deceleration units in some embodiments.

An end station 211 supports one or more substrates, such as substrate 138, in the path of ribbon ion beam 212 such that ions of the desired species are implanted into substrate 138. The substrate 138 may be, for example, a silicon wafer. The end station 211 may include a platen 295 to support the substrate 138 and a backside gas cooling apparatus 297. The end station 211 also may include a scanner (not shown) for moving the substrate 138 perpendicular to the long dimension of the ribbon ion beam 212 cross-section, thereby distributing ions over the entire surface of substrate 138. Although the ribbon ion beam 212 is illustrated, other embodiments may provide a spot beam.

The ion implanter may include additional components known to those skilled in the art. For example, the end station 211 typically includes automated substrate handling equipment for introducing substrates into the beam-line ion implanter 200 and for removing substrates after ion implantation. The end station 211 also may include a dose measuring system, an electron flood gun, or other known components. It will be understood to those skilled in the art that the entire path traversed by the ion beam is evacuated during ion implantation. The beam-line ion implanter 200 may incorporate hot implantation of ions in some embodiments.

One skilled in the art will recognize other systems and processes involved in semiconductor manufacturing, other systems and processes involved in plasma treatment, or other systems and processes that use accelerated ions that may perform the cooled cleaving implant process described herein. Some examples of this, for example, are a plasma doping tool, an ion shower, or a plasma immersion tool. Other semiconductor processing equipment known to those skilled in the art that can accelerate species and implant species into a substrate also may be used. Thus, this process is not limited solely to beam-line ion implanters.

Figure 4:
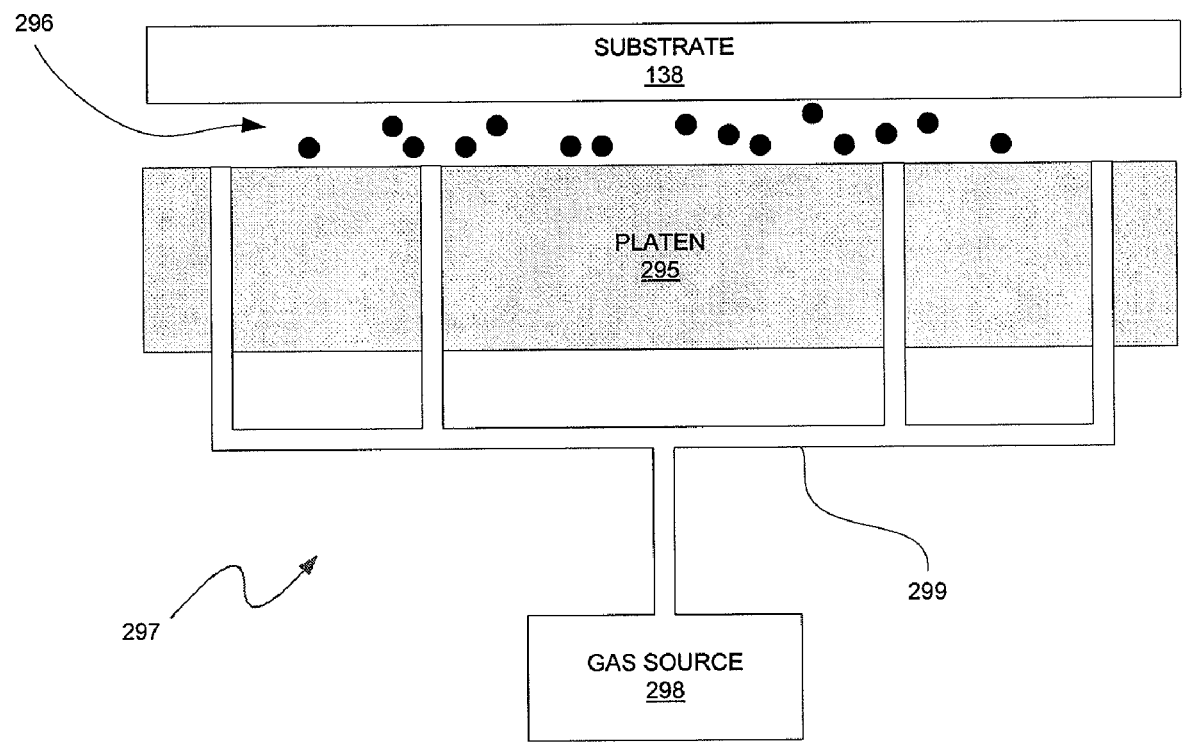
FIG. 4 is an embodiment of substrate cooling during implantation.

FIG. 4 is an embodiment of substrate cooling during implantation. Platen 295 may have a backside gas cooling apparatus 297 in some embodiments to perform backside gas thermal coupling in the beam-line ion implanter 200 as illustrated in FIG. 3. Due to the thermal load that occurs during implantation, the substrate 138 may require more cooling than only a pre-chill prior to implantation. Substrate cooling involves lowering the temperature, either during implantation or during other times, through use of, for example, backside gas cooling or other cooling methods. Substrate cooling also may involve maintaining a temperature of a substrate if the substrate is subject to a source of heat or begins rising in temperature, such as during implantation.

Here, the gas source 298 provides atoms or molecules 296 between the platen 295 and the substrate 138 using a plurality of conduits 299. The gas atoms or molecules 296 flow between the substrate 138 and the platen 295. The gas atoms or molecules 296 strike the surface of platen 295 and acquire translational and rotational energies corresponding to the temperature of the platen 295. This energy corresponding to the temperature of the platen 295 may be described using an accommodation coefficient for the coupling experienced between the atom or molecule 296 and the surface struck. An accommodation coefficient depends on details of the atom or molecule 296 (such as degrees of freedom) and the details of the surface that is struck (such as roughness or sticking coefficient).

The thermalized atom or molecule 296 then travels across the gap between the substrate 138 and the platen 295. If the distance between substrate 138 and platen 295 is small compared to the mean free path of the atom or molecule 296, meaning the average distance traveled between collisions, the trip across the gap will be direct. When an atom or molecule 296 reaches the substrate 138, the same thermalization process will occur with substrate 138. If the substrate 138 is hotter than the platen 295, the atom or molecule 296 will absorb energy from the substrate 138. If the platen 295 is hotter than the substrate 138, then the atom or molecule 296 will absorb energy from the platen 295. As the atoms or molecules 296 travel between the substrate 138 and the platen 295, the two surfaces are brought toward the same temperature. In this manner, the substrate 138 may be either heated or cooled. This heat transfer may be made less efficient if there are large numbers of collisions between the gas atoms or molecules 296 because the atoms or molecules will then share energy between each other.

Higher gas pressure would mean more atoms or molecules 296 to transfer heat between the substrate 138 and the platen 295, but would also mean a shorter mean free path. Thus, at low pressure, heat transfer is proportional to gas pressure. As pressure rises to a point where mean free path drops to the platen-substrate separation, the increase will start to fall off. Higher pressure may be used by keeping the substrate 138 nearer to the platen 295. Clamping pressure must be higher than backside gas pressure.

A unit could also be used to additionally cool a substrate in the beam-line ion implanter 200 as illustrated in FIG. 3 in some embodiments. This may be through use of a pre-chill station or a thermal conditioning unit 279 where a substrate rests, which may be in the end station 211 in one embodiment. A robotic arm may move the substrate between the pre-chill station or thermal conditioning unit 279 and the platen 295. The substrate may be pre-chilled below room temperature, to 0° C., or below freezing, as examples. In one particular embodiment, the substrate is pre-chilled to between 30° C. and −150° C. This pre-chill station may be a platform, such as the backside gas cooling apparatus of FIG. 4 or a cooling plate within the end station 211 or a process chamber. In another embodiment, pre-chilling may take place in a load lock. Other pre-chilling methods also may be used. The pre-chill station or thermal conditioning unit 279 also may be used to cool the substrate after the substrate is implanted.

Figure 5:
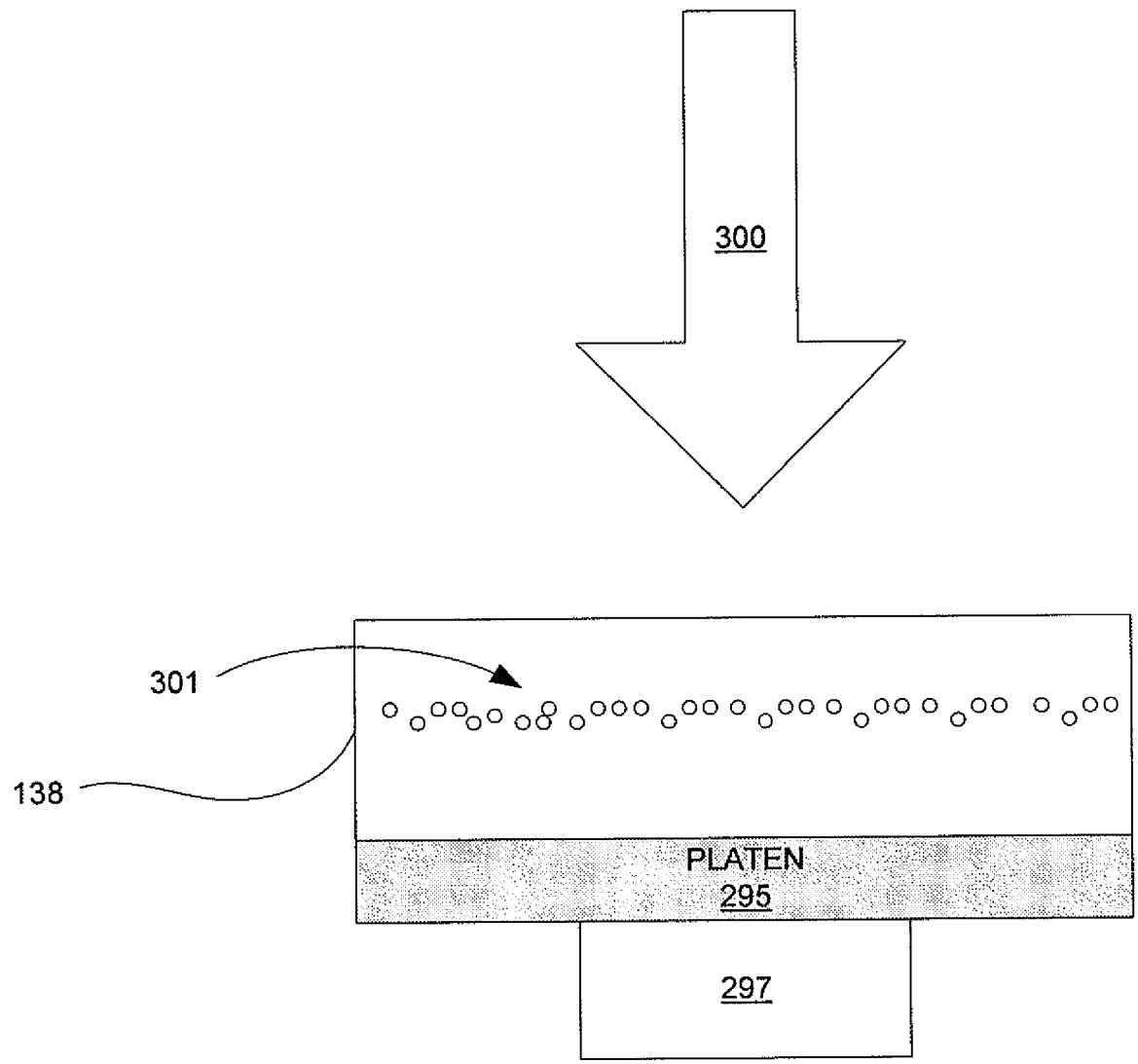
FIG. 5 is an embodiment of an implanted substrate with a layer of microbubbles.

FIG. 5 is an embodiment of an implanted substrate with a layer of microbubbles. A species 300, which may be at least one chemical element in this particular embodiment, is implanted into the substrate 138. In some embodiments, hydrogen may be implanted at 5E16 $cm^{-2}$ or helium and hydrogen co-implants may be implanted at 1E16 $cm^{-2}$ to produce a layer of microbubbles 301 below the surface of the substrate 138. The substrate is later cleaved along this layer of microbubbles 301. In other embodiments, oxygen, nitrogen, other rare gases, or a combination of gases are used to form the layer of microbubbles 301. This may be performed in one implant or a series of implants. Other species known to those skilled in the art also may be used to form the layer of microbubbles 301. Greater implant energy of the species 300 generally will result in a greater implant depth of microbubbles 301. Greater implant dose of the species 300 generally will result in a greater concentration of the species 300 that form the microbubbles 301. If the substrate 138 is cooled, such as with the platen 295 and the backside gas cooling apparatus 297, the size at which the microbubbles are stable may be controlled.

Figure 6:
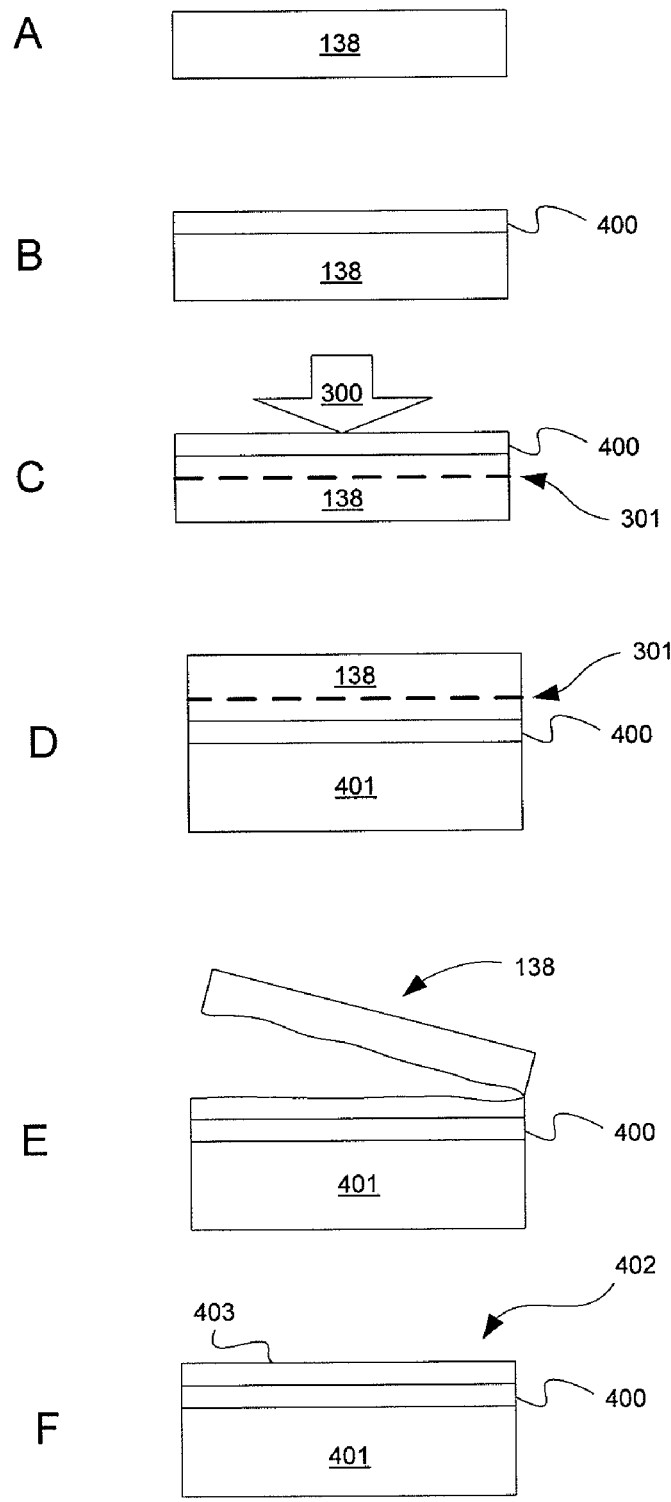
FIG. 6 is an embodiment of silicon-on-insulator (SOI) wafer fabrication.

FIG. 6 is an embodiment of silicon-on-insulator (SOI) wafer fabrication. SOI wafer fabrication may be improved by cooling a wafer while implanting a species to reduce the size at which microbubbles are stable within the wafer. This reduction may be in comparison to a wafer that is implanted with a species without cooling. For example, the mean void diameter caused by implantation may be reduced from approximately 10 nm to approximately 5 nm to 7 nm by cooling. Cooling while implanting to reduce the size at which microbubbles are stable, however, may be applied to other embodiments of SOI wafer fabrication known to those skilled in the art. Furthermore, this process is not solely limited to SOI wafers. Cooling while implanting a species to reduce the size at which microbubbles are stable is also applicable to other cleaving implants such as 3D integrated circuit (IC) or stacked chip configurations. This process also may be applicable to the fabrication of substrates that are used in, for example, flat panels, thin films, solar cells, LEDs, other thin metal sheets, or other devices. The substrate that is cleaved using this process may be, for example, silicon, SiC, GaN, GaP, GaAs, polysilicon, Ge, quartz, or other materials known to those skilled in the art.

In fabricating an SOI wafer, a substrate 138 is provided (A). The substrate 138 may be referred to as a donor wafer. The substrate 138 has a thermal oxide layer 400 formed on at least one surface (B). At least one species 300, such as hydrogen or helium, for example, is then implanted into the silicon of the substrate 138 to form a layer of microbubbles 301 (C). This substrate 138 is then flipped over, bonded to a handle wafer 401, and annealed (D). In some embodiments, the substrate 138 is cleaned prior to bonding it to the handle wafer 401. During the anneal or another thermal process, the substrate 138 fractures or cleaves along the layer of microbubbles 301 (E). The formed SOI wafer 402, including the thermal oxide layer 400 and silicon overlayer 403, may require polishing to make the surface smooth enough for device manufacture (F). In another embodiment, a mechanical, chemical, or fluid force is used to fracture or cleave the substrate 138 along the layer of microbubbles 301. The remaining substrate 138 may be reused in some embodiments.

The surface roughness of the SOI wafer 402 and the silicon overlayer 403 after cleaving depends on the size of the microbubbles in the layer of microbubbles 301. Smaller microbubbles in the layer of microbubbles 301 will lead to a smoother surface of the SOI wafer 402 and the silicon overlayer 403 after cleaving. This may eliminate or limit the polishing step in some embodiments.

Figure 7:
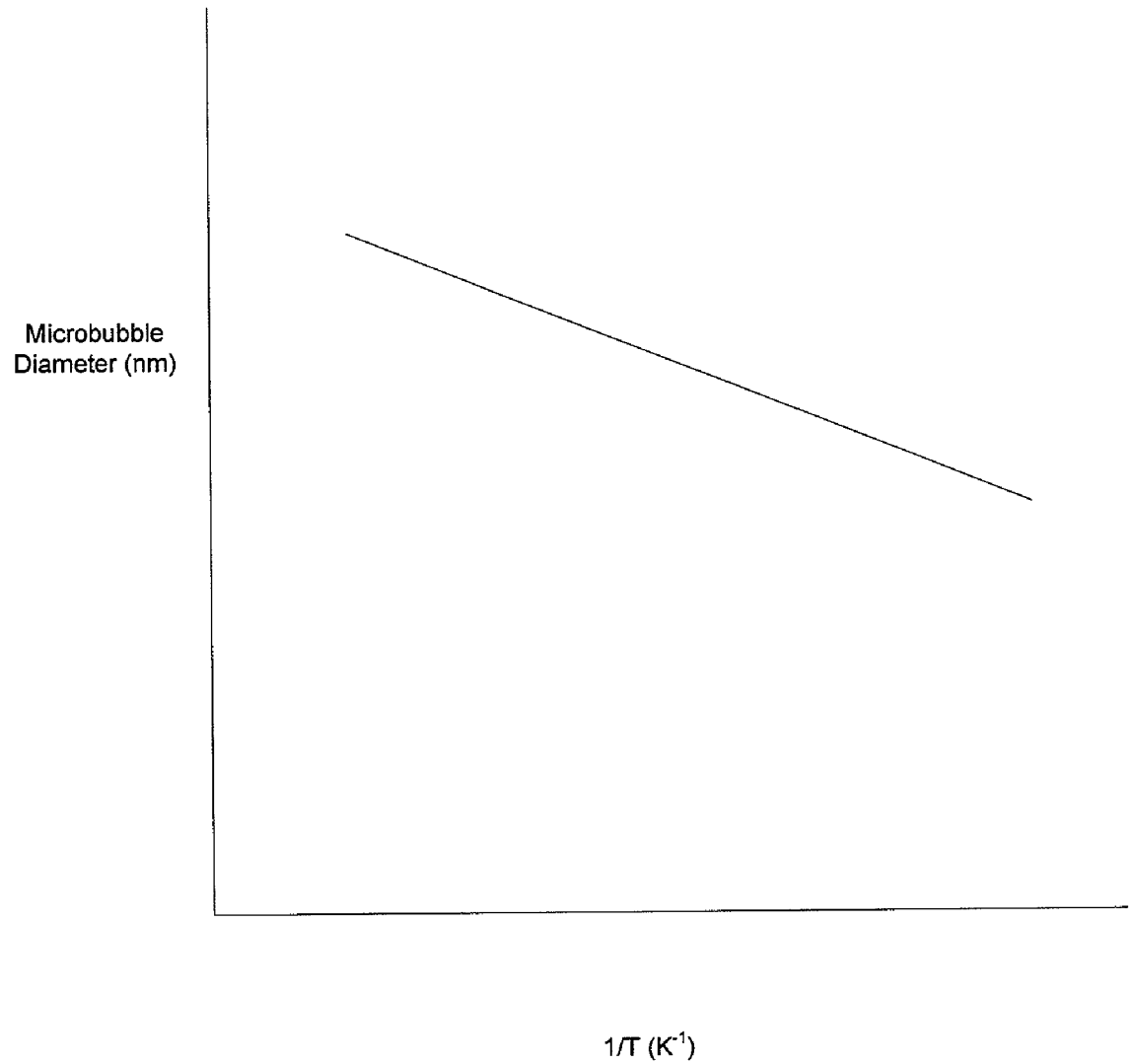
FIG. 7 is a graph comparing microbubble diameter and temperature.

FIG. 7 is a graph comparing microbubble diameter and temperature. This graph approximates the relationship between the microbubble diameter and temperature. While a linear relationship between microbubble diameter and the inverse of temperature (1/T) is illustrated, other nonlinear relationships are also possible. However, the general trend is that microbubble diameter will decrease as temperature decreases.

Figure 8:
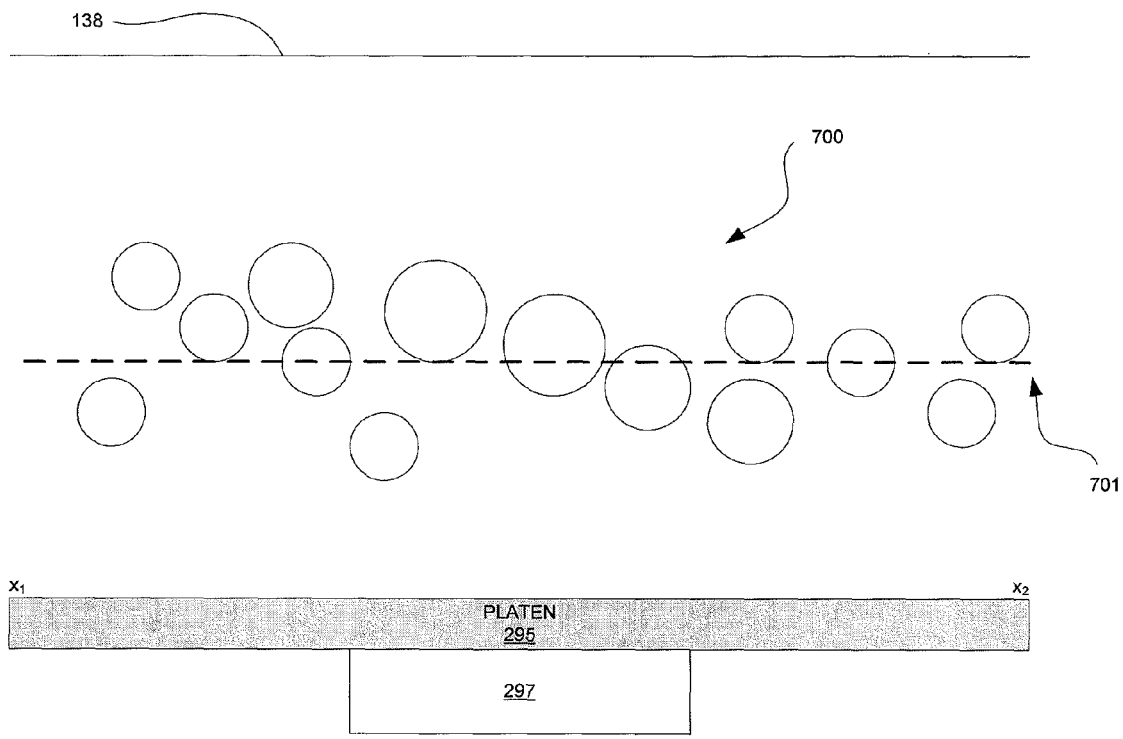
FIG. 8 is a view of an implanted substrate where microbubble size is controlled.

FIG. 8 is a view of an implanted substrate where microbubble size is controlled. FIG. 8 is merely an illustration and is not to scale, although the $x_1$ and $x_2$ references will allow comparison of FIGS. 1-2 and 8-9. Cooling the substrate or lowering the temperature during implant may reduce the size at which the microbubbles 700 are stable within the substrate 138. The smaller the diameter of the microbubbles or the smallest diameter of a stable microbubble will cause a smoother or less jagged surface on the substrate 138 after cleaving along the layer of microbubbles 700. Conventional implantation with an uncooled substrate makes a mean void diameter of about 10 nm. Cooling the substrate or lowering the temperature during implant may reduce or prevent Ostwald ripening and diffusion of the species out of the substrate 138 and, consequently, may reduce the mean void diameter caused by the implant to approximately 5 nm to 7 nm. Cooling may be performed by the platen 295 with a backside gas cooling apparatus 297 in one embodiment. This cooling will affect the substrate 138 when it is cleaved along the weakened layer or porous layer represented by line 701.

Thus, in one embodiment, the temperature of the substrate 138 may be maintained between approximately −150° C. and 30° C. during the implantation of the species used to form the microbubbles 700. Surface roughness may, thus, be controlled and may be reduced after the substrate is cleaved along the layer of microbubbles 700. In another particular embodiment, the temperature of the substrate 138 may be maintained between approximately −100° C. and −80° C. during the implantation of the species used to form the microbubbles 700. In other embodiments, the temperature of the substrate 138 may be maintained below approximately −150° C. or between approximately 30° C. and 50° C. during implantation. A temperature gradient or temperature model that is not constant also may be used within these disclosed temperatures in some embodiments. Thus, the temperature of the substrate 138 may be configured to change over time before, during, or after the implantation of species used to form the microbubbles 700. These temperatures or temperature models may be specifically configured to reduce the size at which the microbubbles 700 are stable or reduce diffusion of the implanted species that form the microbubbles 700.

Figure 10:
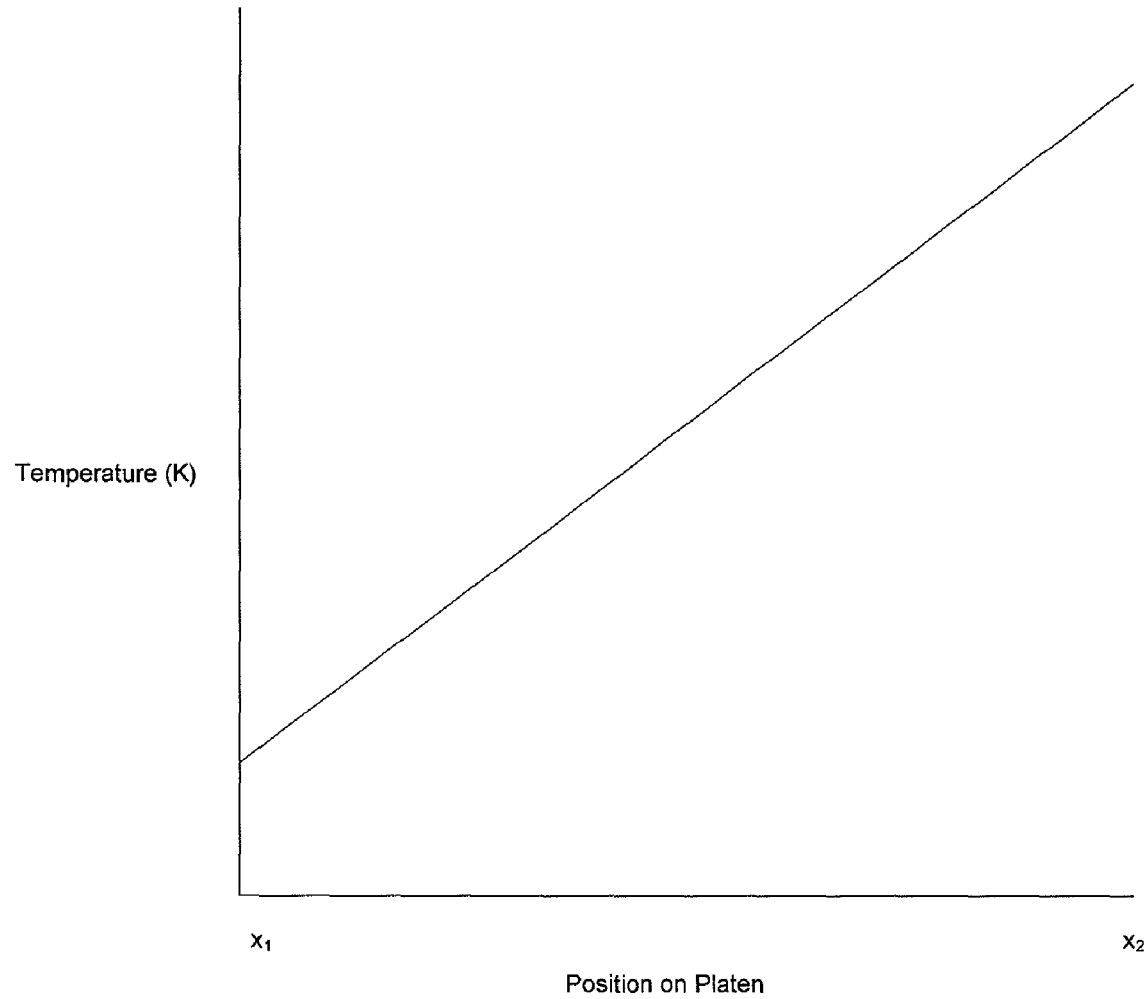
FIG. 10 is a graph comparing temperature to position on a platen.

A temperature gradient across the substrate may use a platen with zones that cool the substrate to different temperatures in the different zones of the platen in one particular embodiment. FIG. 10 is a graph comparing temperature to position on a platen. As illustrated, the temperature increases as the position on the platen moves from $x_1$ to $x_2$. In other embodiments, a platen is divided into two or more regions, at least two of these regions having different temperatures. These temperature gradients may be combined with a temperature model that changes over time in one particular embodiment. Preferential cleaving starting from a particular region of the substrate 138 due to the difference in microbubble 700 size may occur due to such a temperature gradient in one particular embodiment. These temperature gradients may be specifically configured to reduce the size at which the microbubbles 700 are stable or reduce diffusion of the implanted species that form the microbubbles 700.

These lower temperatures below 50° C. or between −150° C. and 30° C. will stabilize the smallest microbubbles and prevent these from evaporating or diffusing. These lower temperatures may be performed by, for example, a backside gas apparatus, such as the platen 295 and backside gas cooling apparatus 297 in the beam-line ion implanter 200 of FIG. 3. This also may be supplemented with or performed by a pre-chill station or thermal conditioning unit 279 in some embodiments. In another embodiment, this lower temperature is maintained after the implantation is completed.

Diffusion of the implanted species that form the microbubbles 700 within the substrate 138 also may be reduced or prevented by the lower temperature. For example, if a substrate is maintained below approximately 50° C., diffusion is reduced compared to a substrate at a higher temperature. This lower temperature may be maintained during implantation or after implantation of the species that forms the microbubbles 700. The reduced diffusion will reduce the size at which the microbubbles 700 are stable within the substrate 138. This is because diffusion of the implanted species may increase the size of some of the microbubbles 700. Diffusion of the implanted species out of the substrate 138 also may be reduced.

If diffusion of the species that forms the microbubbles 700 is reduced and the implanted species remains at the location and depth of implantation, the dose of the implanted species may be reduced or otherwise configured to account for this reduced diffusion. A lower dose may be used in some embodiments because the species will not diffuse away from the location and depth of implantation. The implant energy also may be reduced or otherwise configured to account for this reduced diffusion. The implant energy may be configured to implant the species only at a particular depth in some embodiments because the species will remain there if diffusion is reduced. Thus, a wider implant depth range is not required. This lower dose or lower energy also may prevent temperature rises due to implantation.

Figure 9:
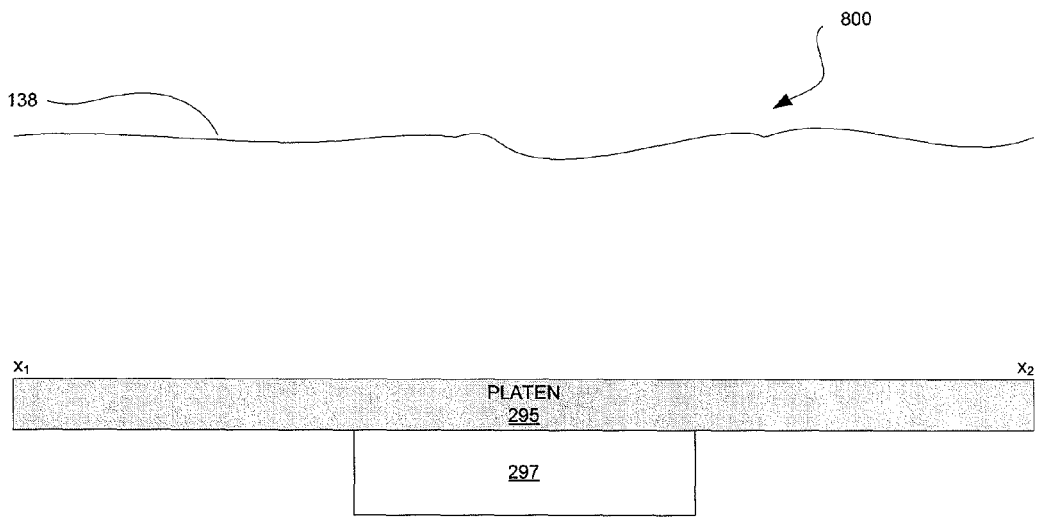
FIG. 9 is a view of the substrate of FIG. 8 after the substrate is cleaved.

FIG. 9 is a view of the substrate of FIG. 8 after the substrate is cleaved. The substrate 138 in FIG. 8 was cleaved along the weakened layer or porous layer represented by line 701. As illustrated in FIG. 9, surface roughness 800 is reduced compared to that of the uncooled substrate illustrated in FIG. 2.

A channeled implant of the species that form the microbubbles 700 may be performed in some embodiments. This is an implant of a species substantially between the crystal lattice of the substrate 138. The substrate 138 is oriented relative to an incident angle of the species to substantially implant the species between a crystal lattice of the substrate in one particular embodiment. In other embodiments, the implanted species may need to be configured to be implanted at a specific angle. This may reduce the temperature of the substrate 138 during implantation or an amount of cooling required to cool the substrate 138. Due to the reduced thermal load caused by the implant and the implanted species impacting the substrate 138, a channeled implant may, thus, make it easier to cool the substrate 138 during implantation. These channeled implants also may reduce the implant energy required for implanting the species that forms the microbubbles 700. However, the implants of the species that forms the microbubbles 700 may need to be configured to account for the effect of the channeled implant such that the species is implanted to a particular depth.

In some embodiments, both hydrogen and helium are implanted to form the microbubbles 700. Hydrogen may be implanted prior to helium or helium may be implanted prior to hydrogen. In another embodiment, both are implanted at least partially simultaneously. The hydrogen may form the microbubbles 700 and may stabilize any damage in the substrate 138 in some embodiments. The more insoluble helium may further fill these microbubbles and may seek any damage in the substrate 138. Due to the differences between hydrogen and helium or due to the reduced diffusion of the implanted species that form the microbubbles 700 within the substrate 138, the projected range, implant depth, or implant energy of the hydrogen and helium implants may need to be configured. Thus, the hydrogen and helium implants may be configured to implant hydrogen and helium on the same plane or at the same depth in the substrate 138. Two different energies may be required to implant helium and hydrogen on the same plane or at the same depth in the substrate 138.

The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A method comprising:
    performing ion implantation into a substrate with a species to form a layer of bubbles in said substrate, wherein said species is selected from the group consisting of hydrogen, helium, nitrogen, and oxygen; and
    controlling a size of said bubbles within said substrate by cooling said substrate to an implant temperature approximately between −150° C. and 30° C. during said ion implantation using a platen with at least a first zone and a second zone, wherein said controlling comprises cooling a first region of said substrate to a higher temperature than a second region of said substrate, said first region disposed on said first zone and said second region disposed on said second zone, said first zone operating at a first temperature and said second zone operating at a second temperature different than said first temperature, wherein said bubbles have a larger diameter in said first region than said second region.

2. The method of claim 1, wherein said method further comprises selecting at least one of an implant energy and an implant dose of said species in response to a rate of diffusion of said species in said substrate caused by said cooling.

3. The method of claim 1, wherein said method further comprises varying said implant temperature over an implanting time interval.

4. The method of claim 1, wherein said bubbles have a mean void diameter of approximately 5 nm to 7 nm due to said controlling.

5. The method of claim 1, further comprising cleaving said substrate after said ion implantation, wherein said cleaving begins at said first region of said substrate.

6. The method of claim 1, wherein said cooling said substrate comprises providing a gas between said platen and said substrate.

7. A method comprising:
performing ion implantation into a substrate with hydrogen and helium to form a layer of bubbles in said substrate; and
controlling a size of said bubbles within said substrate by cooling said substrate to an implant temperature approximately between −150° C. and 30° C. during said ion implantation using a platen with at least a first zone and a second zone, wherein said controlling comprises cooling a first region of said substrate to a higher temperature than a second region of said substrate, said first region disposed on said first zone and said second region disposed on said second zone, said first zone operating at a first temperature and said second zone operating at a second temperature different than said first temperature, wherein said bubbles have a larger diameter in said first region than said second region.

8. The method of claim 7, wherein implant energies of said hydrogen and said helium are selected such that said hydrogen and said helium are implanted at a substantially similar depth in said substrate using said ion implantation.

9. The method of claim 7, wherein said method further comprises selecting at least one of an implant energy and an implant dose of at least one of said hydrogen and said helium in response to a rate of diffusion of at least one of said hydrogen and said helium in said substrate caused by said cooling.

10. The method of claim 7, wherein said method further comprises varying said implant temperature over an implanting time interval.

11. The method of claim 7, further comprising cleaving said substrate after said ion implantation, wherein said cleaving begins at said first region of said substrate.

12. The method of claim 7, wherein said cooling said substrate comprises providing a gas between said platen and said substrate.

13. A method comprising:
performing ion implantation into a substrate with hydrogen to form a layer of bubbles in said substrate; and
controlling a size of said bubbles within said substrate by cooling said substrate to an implant temperature approximately between −150° C. and 30° C. during said ion implantation using a platen with at least a first zone and a second zone, wherein said controlling comprises cooling a first region of said substrate to a higher temperature than a second region of said substrate, said first region disposed on said first zone and said second region disposed on said second zone, said first zone operating at a first temperature and said second zone operating at a second temperature different than said first temperature, wherein said bubbles have a larger diameter in said first region than said second region.

14. The method of claim 13, wherein said method further comprises selecting at least one of an implant energy and an implant dose of said hydrogen in response to a rate of diffusion of said hydrogen in said substrate caused by said cooling.

15. The method of claim 13, wherein said method further comprises varying said implant temperature over an implanting time interval.

16. The method of claim 13, further comprising cleaving said substrate after said ion implantation, wherein said cleaving begins at said first region of said substrate.

17. The method of claim 13, wherein said cooling said substrate comprises providing a gas between said platen and said substrate.

* * * * *